United States Patent [19]
Tepman et al.

[11] Patent Number: 5,922,133
[45] Date of Patent: Jul. 13, 1999

[54] MULTIPLE EDGE DEPOSITION EXCLUSION RINGS

[75] Inventors: Avi Tepman, Cupertino; James van Gogh, Sunnyvale, both of Calif.

[73] Assignee: Applied Materials, Inc., Santa Clara, Calif.

[21] Appl. No.: 08/928,995

[22] Filed: Sep. 12, 1997

[51] Int. Cl.⁶ ............................ C23C 16/00; C23C 14/00
[52] U.S. Cl. ..................... 118/720; 118/728; 118/503; 118/504; 204/298.11; 427/248.1
[58] Field of Search .................. 118/728, 503, 118/504, 720, 721; 204/298.11; 427/248.1

[56] References Cited

U.S. PATENT DOCUMENTS

| | | | |
|---|---|---|---|
| 4,978,412 | 12/1990 | Aoki et al. | 156/345 |
| 5,262,029 | 11/1993 | Erskine et al. | 204/298.15 |
| 5,421,401 | 6/1995 | Sherstinsky et al. | 165/80.2 |
| 5,437,757 | 8/1995 | Rice et al. | 156/345 |
| 5,534,110 | 7/1996 | Lenz et al. | 156/643.1 |
| 5,540,821 | 7/1996 | Tepman | 204/192.13 |
| 5,605,866 | 2/1997 | McClanahan et al. | 437/225 |
| 5,632,873 | 5/1997 | Stevens et al. | 204/298.15 |

*Primary Examiner*—R. Bruce Breneman
*Assistant Examiner*—Jeffrie R Lund
*Attorney, Agent, or Firm*—Janis Biksa

[57] ABSTRACT

An exclusion ring system for depositing a film with multiple exclusion zones on a substrate in a deposition apparatus having a pedestal for supporting the substrate at different positions. A first exclusion ring is positioned above the substrate and pedestal and extends over a first zone overlying the perimeter of the substrate up to a first inner periphery. A second ring is positioned between the first ring and the substrate and extends over a second zone overlying the perimeter of the substrate outwardly of the first zone to a second inner periphery lying outwardly of the first inner periphery. When the pedestal is in a raised position, it supports the rings. When the pedestal is in a lowered position, the rings are supported by legs resting on a stationary wall, the legs of the first ring being effectively longer than the legs of the second ring so that the rings are sequentially moved away from the substrate as the pedestal is lowered. Initially, the first ring is in a position proximate the substrate to prevent deposition of the first film over the first zone. Then the pedestal is lowered to a position where the first ring is moved away from the substrate by its leg being supported. This leaves the second ring as an effective exclusion ring at the second position so that the second film is deposited over the first and over the second zone and also extends outwardly to cover and protect the edge of the first film.

11 Claims, 5 Drawing Sheets

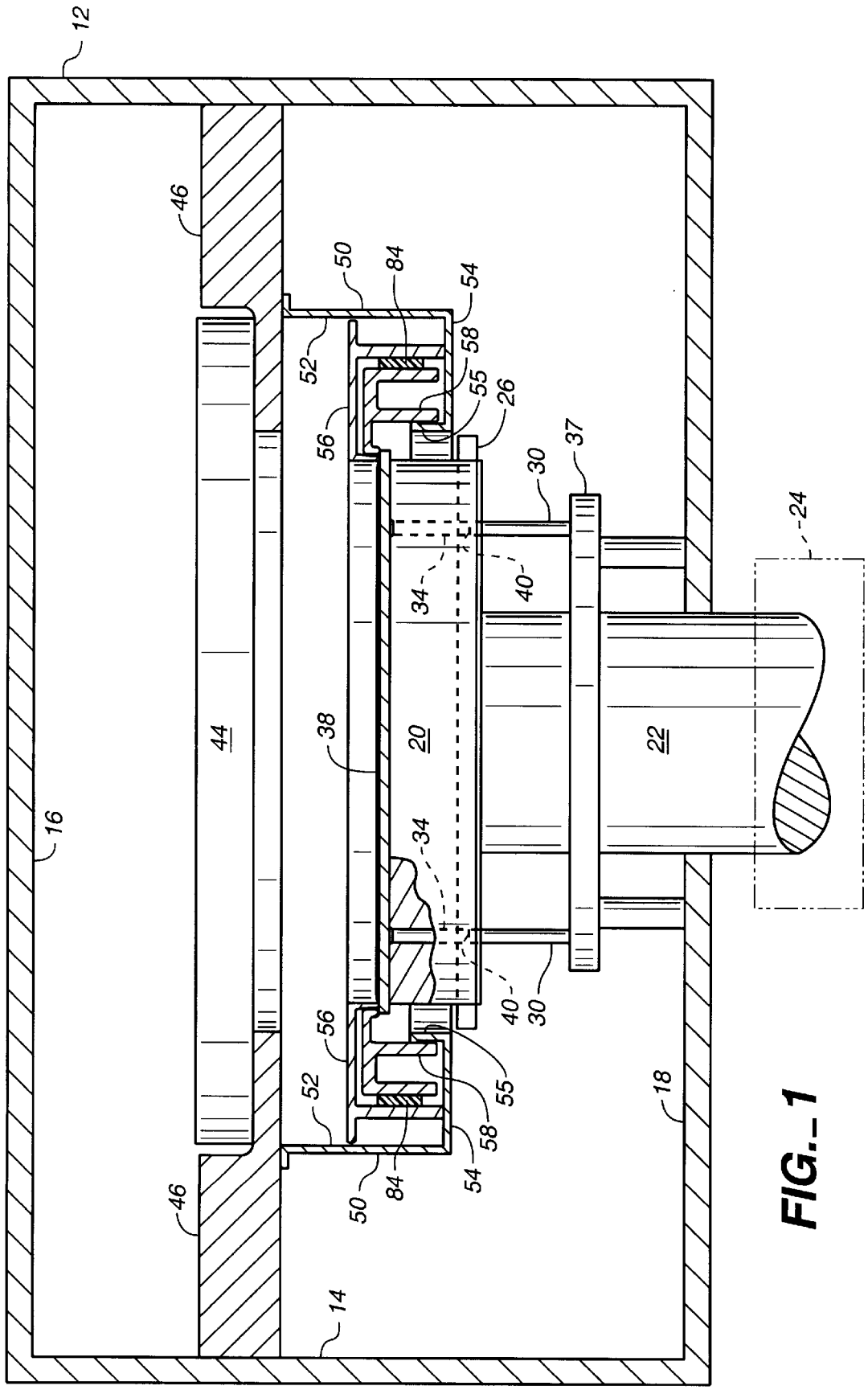
FIG._1

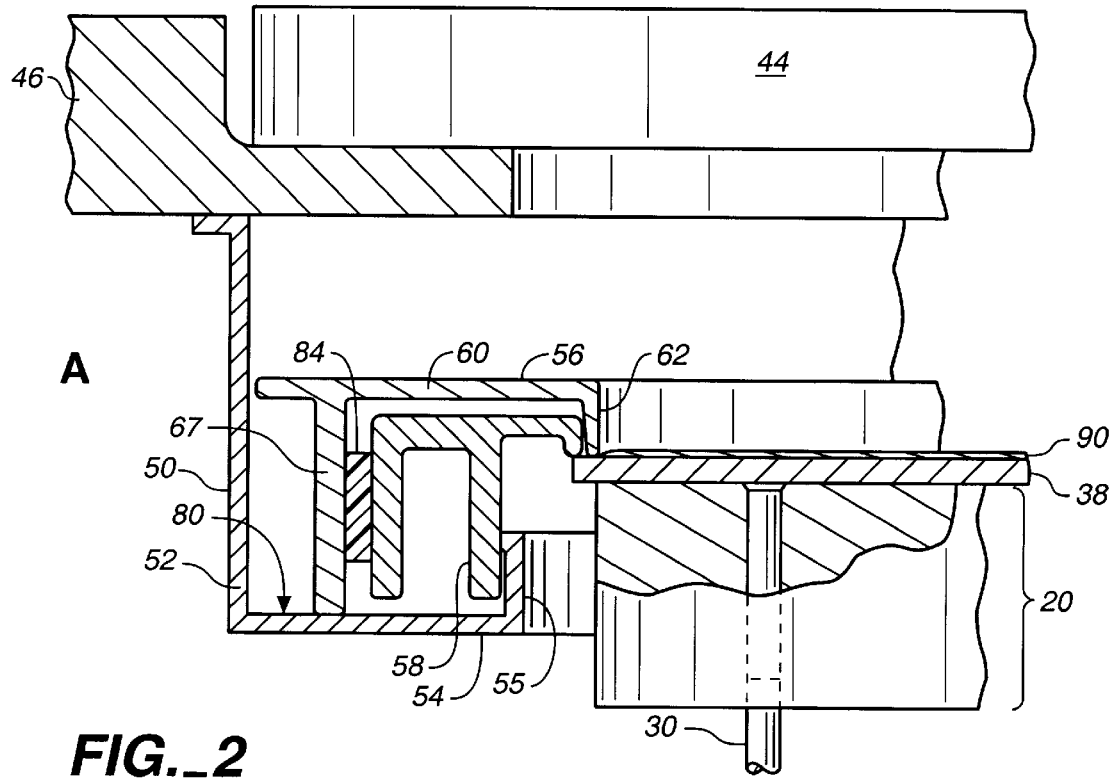
FIG._2
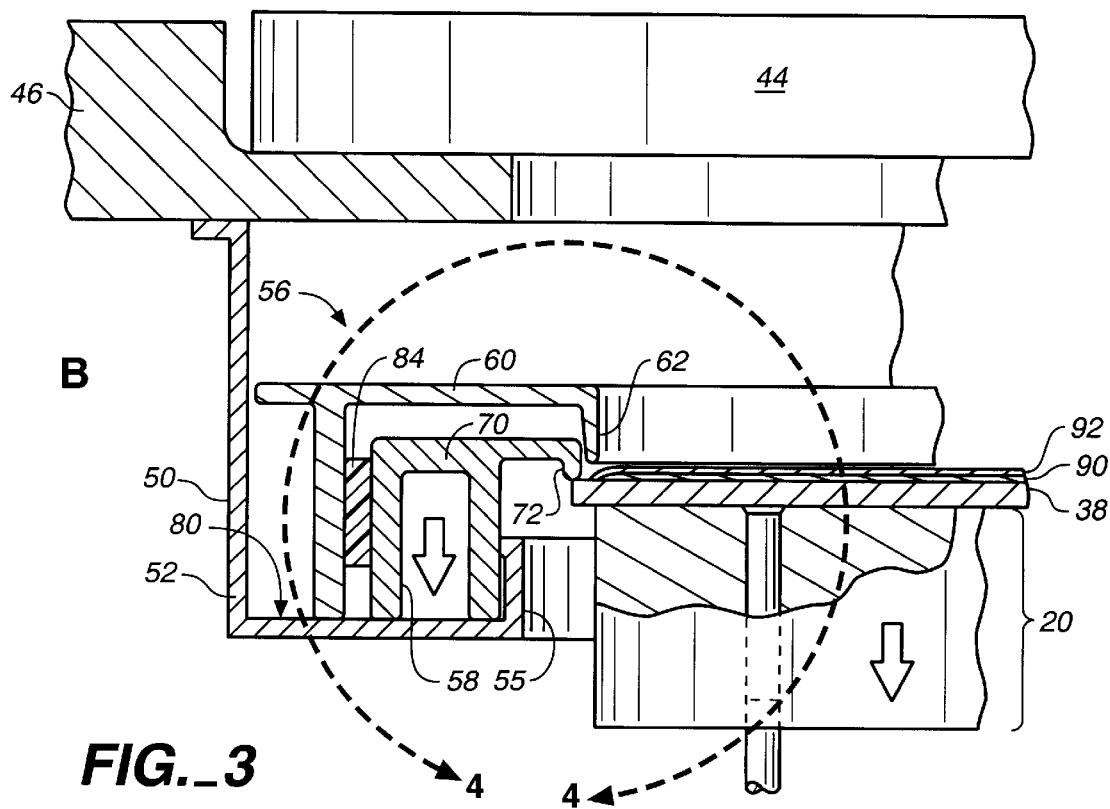
FIG._3

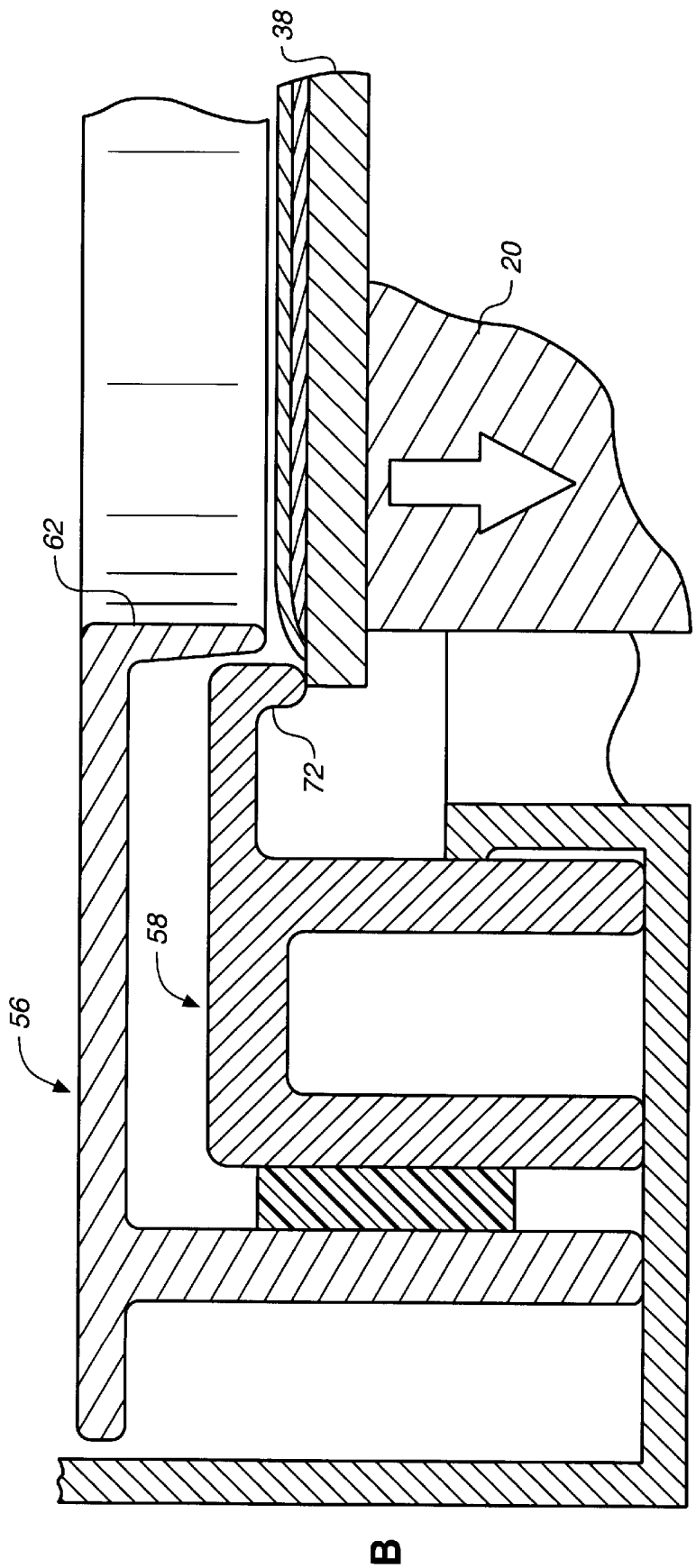
FIG._4

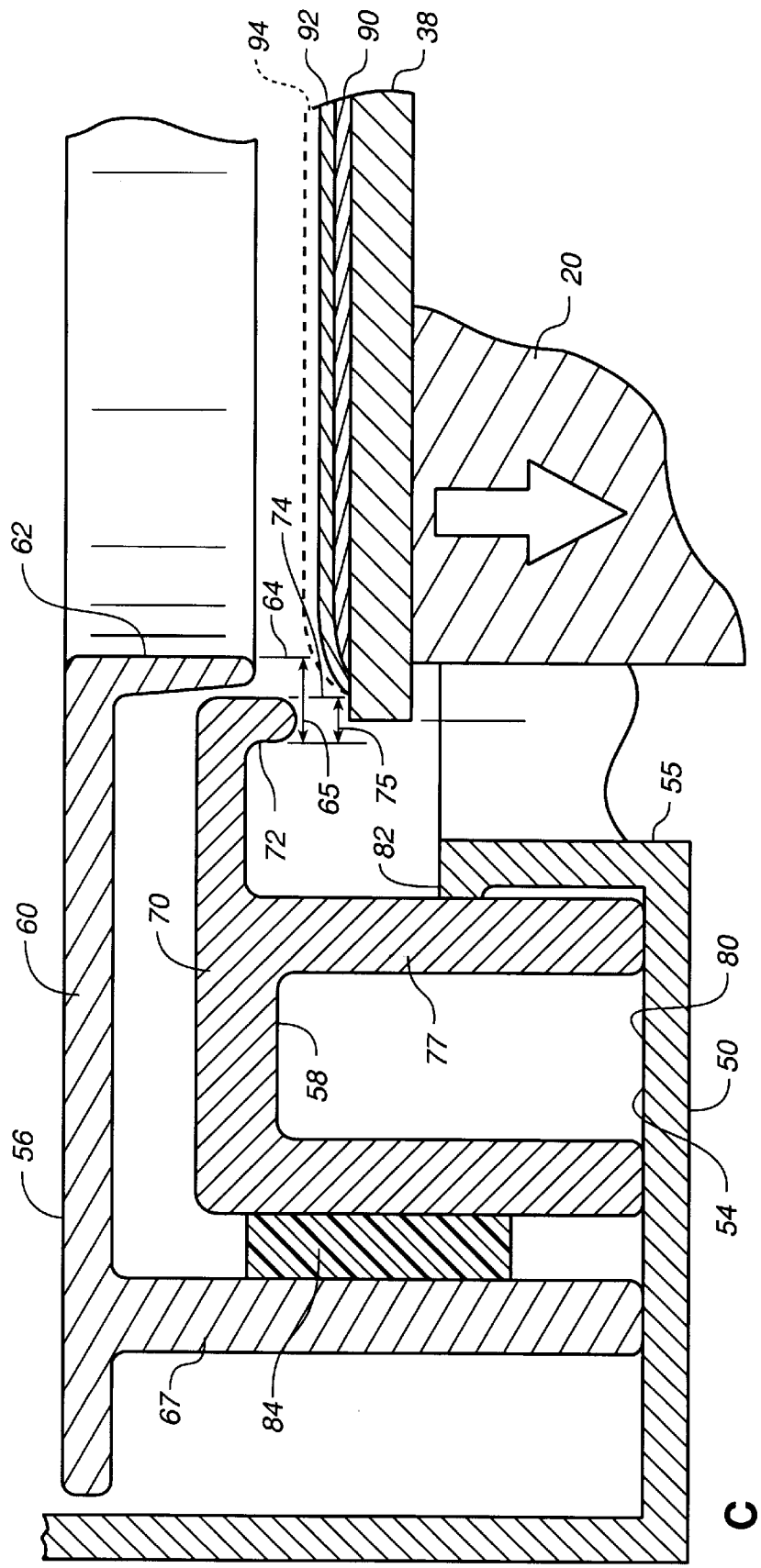
FIG._5

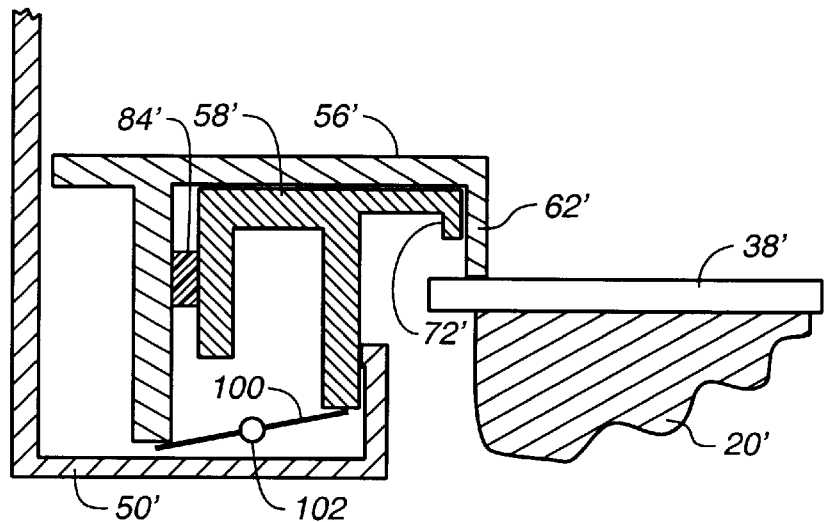
FIG._6
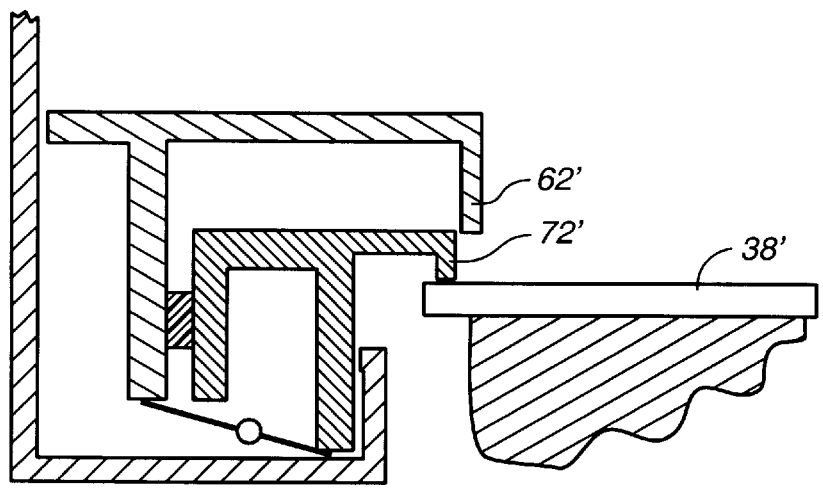
FIG._7
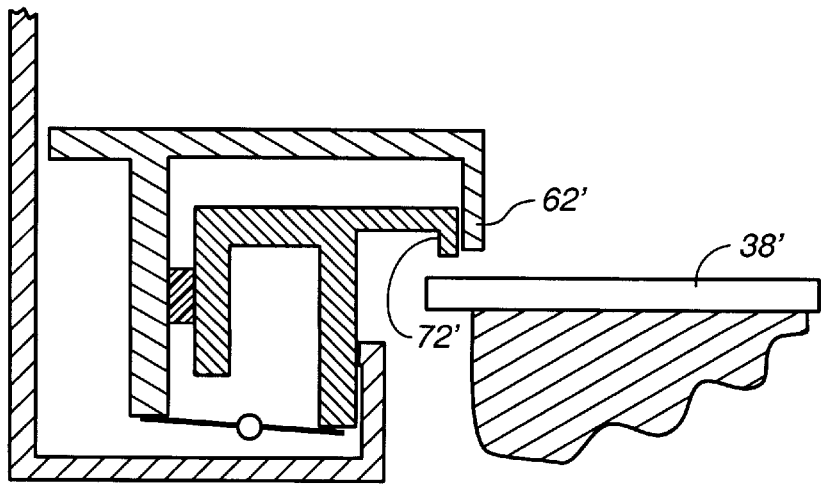
FIG._8

MULTIPLE EDGE DEPOSITION EXCLUSION RINGS

FIELD OF THE INVENTION

This invention relates generally to an apparatus and process for depositing films on semiconductor substrates. More particularly, the invention relates to a substrate edge deposition exclusion ring system for selectively shielding or exposing one or more edge band areas of a substrate during a deposition process in a chamber.

BACKGROUND OF THE INVENTION

Processes for depositing multiple layers of different materials on a semiconducting substrate are fundamental to fabricating semiconductor devices. Typically deposited materials form conductive, semiconductive, or dielectric layers on the substrate. Processes for performing such deposition include chemical vapor deposition (CVD) and physical vapor deposition (PVD). In each of these processes, a source of molecular or atomic species provides molecular and/or atomic species which: travel towards an exposed surface of the substrate, deposit thereon, and build up to form a layer/film of deposited material. Molecular and/or atomic species from the source deposit on all surfaces exposed to the source of molecular or atomic species, i.e., the substrate and all surrounding surfaces.

Exclusion nngs (commonly known as shadow rings and clamp rings) are typically used to set an outside limit of deposition on a substrate. Such rings prevent deposition from occurring on the perimeter of the face of a semiconductor wafer underneath the rings and also assist in preventing deposition on the back side of the substrate.

A shadow ring typically overhangs or closely approaches the perimeter of the face of the substrate but does not rest on the surface of the substrate. In typical CVD processes a gas flow in the gap between the shadow ring and the substrate in a direction opposite the process gas flow purges the gap of process gas and prevents deposition on the face of the substrate adjacent its outer edge and also prevents deposition on the back side of the substrate. An example is shown in U.S. Pat. No. 5,328,722.

A clamp ring typically rests on the perimeter of the face of the substrate. Examples include those shown in U.S. Pat. No. 5,228,501, dated Jul. 20, 1993, to Tepman entitled, "Physical Vapor Deposition Clamping Mechanism and Heater/Cooler" and in European Patent Office publication EP-A 0598362 A1, dated May 25, 1994, entitled "Clamping Ring and Method and Apparatus for Using Same" and the references cited therein, to which reference is made for background descriptions of the structure and use of shadow rings and clamp rings in apparatus of the kind described. As described herein, the term "exclusion ring" is intended to include both shadow rings and clamp rings.

The repeated use of conventional shadow rings and clamp rings with multilayer film deposition processes produces a generally vertical film edge profile, where the removal of the vertical exclusion ring edge leaves the edges of underlying layers exposed. The exposure of the edges of reactive or conductive layers can circumvent the presence and purpose of an intermediate barrier layer which is intended to prevent undesirable chemical reactions or migration of material that might cause electrical contact between the two layers respectively above and below the barrier layer. When using such conventional rings, the presence of a barrier layer/film does not necessarily prevent interaction between the layers above and below the barrier layer at the exposed edge of the deposited film.

For example, in one conventional three layer deposition process a first metal layer of titanium is deposited over silicon, a second barrier layer of titanium nitride is deposited over the titanium, and finally a third metal layer of tungsten is deposited, because the titanium nitride barrier layer does not cover the exposed edge of the titanium layer. When the tungsten layer is deposited by a CVD process using tungsten hexafluoride ($WF_6$), the $WF_6$ has been observed to penetrate to the titanium layer at the perimeter of the film to cause a short circuit.

There is, therefore, a need for an improved deposition apparatus and method which can be used to reduce interaction between successively deposited layers at their exposed edges.

SUMMARY OF THE INVNTION

The present invention uses concentric exclusion rings to permit the deposition of film layers where the edge of each successive layer fully overlaps the edge of the previously deposited film layer. The invention includes an upper (second) ring and an lower (first) ring, each of which has at its inner diameter a lip (or edge of a shield portion) overhanging the semiconductor wafer on which a film is to be deposited. By using two rings each of which is progressively positioned in a first position in contact with the substrate and in a second position separated from the substrate, exposing the portion of the substrate outside the inner edge limit of that ring to the deposition process in the chamber, progressively larger areas (e.g., inner edge band and outer edge band) can deposited by successive steps. When two rings are used, three progressively larger areas of the substrate can be selectively chosen for deposition: a central area, an inner edge band area, and outer edge band area.

The lip of the upper ring, when positioned adjacent to or abutting the wafer, encircles a central area on the face of the wafer on which a film can be deposited. The edge of the upper ring establishes an inner limit of an inner edge band area around the central area of the substrate. The top and side surfaces of the rings are shield portions which prevent deposition there under. The rings may include an extension portion (or leg) which in one configuration supports each ring from the ring support (e.g. the chamber wall shield).

The lip of the lower ring, when positioned adjacent to or abutting the wafer, encircles both the central area and the inner edge band area. The edge of the lower ring establishes an inner limit of an outer edge band area adjacent to the inner edge band area. The outer limit of the area on the substrate exposed to deposition is selected by controlling the relative positions of the upper and lower rings with respect to the substrate.

In one configuration, the invention includes a mechanism for adjusting the spacing between the wafer and each of two rings, by moving a pedestal supporting the substrate so that the rings can alternatively be supported on the edge of the substrate or on another structure (such as a stationary shield) in the processing chamber. In a first position the rings are configured so that their inner edges are supported on or closely approach the substrate surface. As the pedestal moves to a second position interference between a portion of the upper ring and the stationary shield causes the upper shield to move away from the surface of the substrate to expose a larger area of the substrate to the deposition process in the chamber, while the lower shield is in contact with or closely adjacent the surface of the substrate. As the pedestal moves further down to a third position, interference between a portion of the lower ring and the stationary shield causes the lower shield to move away from the surface of the substrate to expose an even larger area of the substrate to the deposition process in the chamber.

The invention can be used in a multi-layer deposition process to deposit successive layers having different diameters. Such a process can overcome the problems of prior art processes caused by interaction of non-adjacent layers at their outer edges (or perimeters).

For example, using the invention in a two layer process in which a conductive layer is deposited over a barrier layer, the barrier layer forms an insulating ledge and prevents the conductive layer from interacting with the silicon substrate beneath the barrier layer.

An apparatus and device according to the invention can provide similar benefits for a three-layer process in which a barrier layer is deposited between two dissimilar metal layers. The barrier layer will overlap the outside edge of the underlying conductive layer, protecting it from interaction with a top conductive layer overlying the barrier layer.

BRIEF DESCRIPTION OF THE DRAWINGS

FIG. 1 is a cross sectional view of a deposition apparatus including the exclusion ring system in accordance with the present invention;

FIG. 2 is an enlarged view of one side of the exclusion ring system of FIG. 1 showing both exclusion rings in positions shielding a substrate;

FIG. 3 is a view similar to that of FIG. 2 showing a change in the configuration of the exclusion ring system, the lower ring continuing to shield the substrate while the upper ring is separated from the substrate to expose its inside edge band to the deposition environment;

FIG. 4 is an enlarged view of a portion of FIG. 3 showing the inner edges (lips) of the exclusion rings and the outer edge of the substrate with the film deposited thereon;

FIG. 5 is an enlarged view similar to that of FIG. 4 showing the system of the invention with the exclusion rings separated from the substrate to expose the whole substrate surface to deposition from the chamber;

FIG. 6 is a schematic cross sectional view of an alternate arrangement of a set of exclusion rings supported by a rocker arm assembly the upper ring being in its lowered position, while the lower ring is in its raised position;

FIG. 7 is a schematic cross sectional view of the exclusion rings of FIG. 6, the upper ring being in its raised position while the lower ring is in its lowered position; and FIG. 8 is a schematic cross sectional view of the exclusion rings of FIG. 6, the upper and lower rings being located off the substrate surface to expose the full diameter of the substrate to the deposition process.

DETAILED DESCRIPTION

Apparatus

The drawings show a particular configuration according to the invention, implemented within a sputtering chamber for depositing a metal film on a semiconductor wafer or substrate. The present invention could also be used in any type of system where film is deposited on a substrate.

FIG. 1 shows a sputtering chamber including a conventional vacuum chamber 12 having one or more side walls 14, a cover 16, and a bottom 18. A sputtering target (cathode) 44 is mounted on a target support member 46 secured to the chamber wall 14. A conventional wafer support pedestal (or heater) 20 supports a semiconductor wafer 38 parallel to the target. In operation, a gas, typically argon, is supplied into the chamber while the total gas pressure is maintained at a high vacuum by a conventional vacuum pump (not shown). A power supply (not shown) applies electrical power to the target 44 to excite the argon gas into a plasma state and applies a negative DC bias voltage on the target which attracts argon ions from the plasma to bombard the target. The bombardment sputters target material from the target surface, and a large portion of the sputtered target material deposits on the wafer 38.

The wafer support pedestal 20 is mounted on a shaft (or stem) 22 which extends through the bottom 18 to a conventional lift mechanism 24 for raising and lowering the pedestal 20. The pedestal 20 can be lowered to a position where the wafer 38 is aligned with a loading port or aperture 26 in the chamber wall 14. As the pedestal 20 and wafer 38 descend, the bottom end of lift pins 30 which are in contact with the lift pin support ring 37 slide up through the lift pin guide holes 34 such that the tops 40 of the lift pins 30 contact the bottom of the wafer 38 to support the wafer 38 aligned with the loading port 26 as the pedestal 20 continues to descend. The wafer 38 is then supported elevated above the pedestal 20 so that robot arm (not shown) can access the elevated wafer and carry it into and out of the chamber 12. The lift mechanism 24 raises the wafer 38 to a position closer to the target 44 during the deposition process.

As shown in FIG. 1, upper and lower exclusion rings 56 and 58 encircle the wafer 38. As detailed in FIGS. 2–5, each of the two rings 56 and 58 has an annular inner lip 62 and 72, respectively, each having an inner edge. The edge of the lip 62 of the upper ring 56 is configured to contact the wafer and shield a perimeter of the wafer while exposing an inner diameter smaller than the inner edge of the lip 72 of the lower ring 58, so that the upper ring 56 exposes a smaller deposition area on the wafer 38 than the lower ring 58. (A configuration for a circular substrate is shown, although a rectangular or other shaped substrate could also be processed with a correspondingly shaped ring within a lip edge having an inner limit generally offset inwardly from the outline of the substrate).

Specifically, if the wafer 38 and the edge of the lip 62 of the upper ring 56 (see FIG. 2) are positioned in contact or immediately adjacent to one another, the shield portion (including at least the lip 62 and a horizontal portion 60) of the upper ring 56 will cover or "shadow" (prevent deposition on) a region 65 (see FIG. 5) at the perimeter of the wafer (from the inner limit of the lip 62 outward), thereby causing the first deposited film 90 to have a first film perimeter 64. If the wafer 38 and the edge of the upper ring 56 are positioned separated from the surface of the wafer 38 to allow deposition outwardly from the inner limit of the edge of the upper ring 56, and the lower ring 58 (as pictured in FIGS. 3 and 4) is positioned in contact with or closely adjacent to the surface of the wafer 38, then the lower ring will shield, cover, or "shadow" an outer perimeter region (or outer edge band) 75 (see FIG. 5) of the wafer so as to protect the perimeter region 75. The second deposited film 92 will thereby have a second film perimeter 74. The second film perimeter 74 defined by the edge of the lip 72 of the lower exclusion ring 58 has a greater diameter than the first film perimeter 64 defined by the edge of the lip 62 of the upper exclusion ring 56. The perimeter band between the first and second film perimeters 64, 74 is being identified as the inner edge band of the wafer. When selectively using one of the two rings 56, 58 with one of their edges shielding a portion of the wafer, a film can be deposited on the wafer having one of the first and second film perimeters 64 and 74.

Optionally, as shown in FIG. 5, a film can be deposited on the wafer having a perimeter (diameter) larger than the first and second film perimeters 64 and 74. This is accomplished when the edges of the lips of the upper and lower rings 56, 58 are is positioned so as to expose the area beyond the second film perimeter 74 to the deposition process. The third deposited film 94 (shown by dashed lines in FIG. 5) will cover the area on the wafer beyond the second film perimeter 74 and can cover the entire surface of the wafer. Utilizing this option permits choosing one of three different film diameters to be deposited on the wafers by configuring the exclusion rings at selected distances from the wafer to expose only the desired wafer perimeter areas to the deposition process in the chamber. Additionally, multiple exclusion rings can be used nested to create additional exclusion regions.

A sputtering chamber conventionally includes a shield 50 which surrounds the wafer 38 and the exclusion rings 56, 58 and acts as a barrier to prevent sputter-deposited material from depositing on the wall of the chamber. Typically, the shield 50 is removable so that it can be removed and cleaned before the accumulated material begins to flake off and contaminate the wafer. In the illustrated embodiment (see FIGS. 1 and 2), such a shield 50 is configured to also perform a second function, namely, to support and guide the two exclusion rings 56 and 58. The shield 50 has a cylindrical side wall 52 the top of which is mounted to a wall of the chamber 14. The side wall 52 extends below the cathode support 46 to an annular bottom wall or floor 54. The bottom wall 54 of the shield extends radially inwardly toward the wafer support pedestal 20, and is provided with an upwardly extending cylindrical lip 55 at its innermost limit.

Referring to FIGS. 1, 2, and 5, the embodiment of the upper ring 56 includes an annular, horizontal, upper portion 60 whose perimeter lies just within the cylindrical side wall 52 of the shield 50. The shield side wall 52 thereby aligns the upper ring 56 in a fixed lateral position encircling the wafer 38, while permitting the upper ring 56 to slide vertically within the shield sidewall 52. The previously described inner lip 62 of the upper ring 56 descends from the inner circumference of the upper portion 60 to contact Sthe top perimeter of the wafer as discussed above.

A first cylindrical leg 67 spaced somewhat inward of the shield side wall 52, extends downwardly from the upper portion 60. The first leg 67 is supported on the floor 54 of the shield 50 as shown in FIGS. 3, 4, and 5, except when the wafer support pedestal 20 lifts the upper ring 56 as shown in FIGS. 1 and 2. The length of the cylindrical leg 67 establishes the height of the upper ring above the floor 54 of the shield 50.

In one embodiment the lower ring 58 includes an annular, horizontal, upper portion 70 from whose inner circumference descends the previously described inner lip 72. Also extending downwardly from the upper portion 70 is a cylindrical inner leg 77 whose inner circumference lies just within the cylindrical lip 55 of the shield 50. The shield lip 55 thereby aligns the lower ring 58 in a fixed lateral position encircling the wafer 38. The inner leg 77 is supported by the floor 54 of the shield 50 as shown in FIG. 5. When the wafer support pedestal 20 lifts the lower ring as shown in FIGS. 1–4 it is supported by its inner lip 72. The length of the cylindrical inner leg 77 sets the height of the lip 72 when the lower ring is supported from the floor 54 of the shield. When both rings 56 and 58 are supported on the floor 54 of the shield 50, the inner lip 72 of the lower ring 58 extends downward (toward the wafer) at least several millimeters further than the lip 62 of the upper ring 56. This enables the wafer 38 to be positioned close enough to the lip 72 of the lower ring 58 for the lower ring 58 to prevent deposition outside the second film perimeter 75 of the wafer, but far enough from the lip 62 of the upper ring 56 so that the lip 62 does not shield the underlying region (inner edge band) of the wafer from deposition, as shown in FIG. 4. To minimize friction between the lower ring 58 and a shield lip 55 as the lower ring slides vertically, the shield lip preferably is provided with a smooth, low-friction boss 82 (FIG. 5) against which the inner leg 77 of the lower ring slides. The boss 82 may be a single, continuous ring encircling the lip 55, or it may be three or more discrete protrusions spaced around the perimeter of the wafer 38.

To further stabilize the upper and lower exclusion rings 56 and 58 as they slide vertically, a boss 84 having a smooth, low friction surface preferably is provided between concentric, cylindrical legs of the two rings. In one embodiment, to reduce the gap between the concentric cylindrical legs of the two exclusion rings, the lower ring 58 further includes an outer, cylindrical leg 86 descending from the annular upper portion 70. The boss 84 may be attached to either the leg 67 of the upper ring or the outer leg 86 of the lower ring. The boss 84 may be a single, continuous ring, or it may be three or more discrete blocks. Although the inner and outer cylindrical legs 77 and 86 of the lower ring are illustrated as being of equal length, one could be longer than the other, in which case the longer one would be the one which establishes the height of the lower ring above the floor 54 (as described above). As an alternative to providing the lower ring 58 with the outer leg 86, the gap between the legs of the two rings could be reduced by providing the upper ring 56 with a second, inner leg and the lower ring with only the inner leg 77. Another alternative would be to fabricate one leg only on each of the two rings, but with the legs and/or the boss 84 being collectively thick enough to span the gap between them and provide a smooth surface to stabilize the rings as they slide vertically relative to each other.

The rings preferably are made of stainless steel, titanium, or aluminum, depending on the material to be deposited, so that their thermal expansion is commensurate with that of the silicon wafer 38 and the material of the films being deposited. Block 84 preferably is made of a dielectric material such as alumina ($Al_2O_3$) in order to keep the rings electrically isolated and to reduce binding between pieces during thermal expansion and contraction cycles.

Operation As Clamping Rings

The exclusion rings of the present invention can be used as clamping rings so that their weight presses the wafer 38 firmly against the pedestal 20 during a deposition process.

The operation of the exclusion rings within a sputtering chamber 12 will be illustrated by a three layer process for depositing thin films to make electrical contact to a transistor on a silicon wafer. The process steps are: (1) sputter deposit a titanium layer over the silicon; (2) sputter deposit a barrier layer of titanium nitride over the titanium; and (3) deposit by using chemical vapor deposition a tungsten layer over the titanium nitride.

Initially, lift mechanism 24 lowers the pedestal 20 well below the lips 62 and 72 of the two exclusion rings and a robot (not shown) places the wafer 38 on the pedestal. The lift mechanism 24 then raises the pedestal 20. As the pedestal rises, the wafer first contacts the lip 72 of the lower exclusion ring 58. As the lift mechanism 24 continues raising the pedestal, the pedestal pushes the wafer upwards against the lower ring 58 so as to raise the lower ring 58 above the floor 54 of the shield, as shown in FIG. 3. At this point, the weight of the lower ring 58 is completely supported by the wafer 38, so that the lower ring 58 functions to clamp the wafer onto the pedestal 20.

If it were desired at this time to deposit a film having the second film diameter 74 defined by the lip 72 of the lower ring 58, the pedestal is stopped at this position and the deposition process takes place. However, in our exemplary deposition process, we desire the first deposited layer 90 to have a smaller diameter than the second deposited layer 92. Therefore, the lift mechanism 24 continues raising the pedestal 20 until the wafer 38 contacts the lip 62 of the upper ring 56.

As shown in FIG. 2, the lift mechanism 24 raises the pedestal high enough so that the wafer 38 supported on the pedestal lifts the upper ring 56 from its support on the floor 54 of the shield 50.

Consequently, the weight of the upper ring 56 is completely supported through the wafer 38 by the pedestal 20, so that both rings 56 and 58 function to clamp the wafer 38 onto the pedestal 20.

When the pedestal has raised the upper ring 56 from the floor 54 of the shield, as shown in FIG. 2, the lift mechanism 24 stops moving and the deposition process begins. In one process, titanium is conventionally sputtered off the target 44 and is deposited on the wafer 38. Because the lip 62 of the upper ring 56 is in contact with the wafer, the upper ring excludes the sputtered titanium from depositing on the perimeter region 65 covered by the upper ring, so that the titanium film 90 deposited on the wafer has a first film perimeter 64 circumscribed by the edge of the lip of the upper ring.

After the titanium film 90 is deposited, the next step is to deposit a titanium nitride (TiN) barrier layer 92 which covers the perimeter edge of the titanium film and overlaps on the wafer, thereby protecting the titanium film from interaction with additional layers to be deposited. To deposit the TiN barrier layer so that its coverage overlaps onto the wafer 38, the lift mechanism 24 lowers the pedestal. As the pedestal descends, the upper and lower exclusion rings 56 and 58 descend along with the pedestal until the cylindrical leg 67 of the upper ring 56 comes to rest on the floor 54 of the shield 50.

As the pedestal 20 continues descending, the upper ring 56 remains stationary, supported by the shield, while the lower ring 58 continues descending along with the pedestal.

Before either of the legs 77 or 86 of the lower ring come in contact with the floor of the shield, the lift mechanism 24 stops the pedestal 20. A TiN barrier layer (second layer) 92 is then deposited on the wafer 38 by a conventional process of sputtering titanium off the target while injecting nitrogen gas above the wafer.

As shown in FIGS. 3 and 4, during the TiN deposition the wafer 38 is several millimeters below the lip 62 of the upper ring 56. In this position the upper ring 56 is too far above the wafer to prevent TiN material from being deposited outside the first film perimeter 64. However, because the lip 72 of the lower ring 58 remains in contact with the wafer 38, the lower ring 58 prevents TiN material from being deposited on the outer perimeter region 75, so that the deposited TiN barrier layer 92 has a second film perimeter 74 greater in diameter than the first film perimeter 64 of the underlying titanium film 90.

The final step of the exemplary process is to deposit a tungsten layer (third film) 94 over the TiN layer (second film).92.

The tungsten may be deposited in a separate chemical deposition chamber, which need not include the upper and lower exclusion rings of the present invention. Because the TiN layer covers the perimeter edge of the titanium layer 90 and overlaps onto the wafer's surface, the TiN barrier layer protects the titanium layer from undesirable interaction with subsequently deposited layers such as the tungsten layer 94, and from interaction with the reagents (such as $WF_6$) used in the deposition of such subsequent layers. Thus the present invention is advantageous over conventional deposition systems in which successive layers are deposited with the same diameters (that is, with their perimeters vertically aligned), so that the perimeter edge of a lower layer is not protected from electrical interaction with upper layers or from chemical interaction with the reagents used to produce the upper layers.

The operation of the upper and lower exclusion rings as described above requires the rings to have certain relative dimensions. When the upper ring 56 is resting on the floor 54 of the shield 50, the height Hu above the floor of the edge of lip 62 equals the difference between the length of the cylindrical leg 67 and the length of the lip 62. Similarly, when the lower ring 58 is resting on the floor of the shield, the height $H_L$ above the floor of the edge of lip 72 equals the difference between the length of the leg 77 (or leg 86, whichever is longer) and the length of the lip 72. When the pedestal 20 is positioned as shown in FIGS. 3 and 4 so that the upper ring rests on the shield floor but the lower ring is supported on the wafer/pedestal above the shield floor 54, the vertical offset between the tips of the two lips 62 and 72 is slightly less than $\Delta H = H_u - H_L$. This vertical offset must be at least several millimeters in order for the lower ring to rest on and clamp the wafer while the upper ring is far enough above the wafer to have negligible shadowing or exclusion effect on the deposition of material below the lip 62 of the upper ring exposing the inner edge band to the deposition process. In this embodiment, to avoid being able to observe the shadowing effect, the two rings must be dimensioned so that $\Delta H$ is at least several millimeters.

Furthermore, the lip 62 of the upper ring 56 should be slightly longer than the lip 72 of the lower ring 58 so that, when both rings are lifted by the pedestal as shown in FIG. 2, there will remain a slight gap between the respective upper portions 60 and 70 of the two rings.

Operation Of Exclusion Rings Without Clamping

The shielding effect of the exclusion rings is present even when they are not in contact with the substrate, but are slightly spaced upward from the substrate. A space of up to about one mm is expected to be appropriate for many deposition cases. By maintaining a slight space, as just defined, the shielding effect is entirely present while avoiding any edge buildup of deposited film at the line of contact between the edge of the lip 62 and the substrate 38. Whether or not the edge of the ring is positioned in contact with the substrate, the floor 54, the leg 67, and the lifting mechanism 24 together define means for supporting the first (upper) ring and maintaining its position relative to the pedestal at a first predetermined position (A) (FIG. 2) in which upper ring 56 shields the substrate from a first film deposition beyond the first periphery defined by the edge of the lip 62.

Then, as the pedestal is lowered further towards position (B) (FIGS. 3 & 4), the lower ring is supported by the floor 54 (of trough 80), causing lip 62 to raise further from the substrate and to fully clear ring 56 from any effect in shadowing the wafer and thus to expose the inner ring 58 which remains with its lip 72 positioned on or near the wafer, continuing to shadow the wafer periphery, as shown in FIGS. 3–4. This position is defined herein as position B. At this position, the edge of the lip 72 of the second ring 58 is in contact with the substrate at inner periphery 74.

As the pedestal is lowered further the lower ring becomes supported by the floor 54 of trough 80, causing its lip 72 to separate from the substrate. Again, it is found that the shielding effect of the second exclusion ring is present even when it is not in contact with the substrate, but is slightly spaced from the substrate, as previously described. By maintaining a slight space, as just defined, the shielding effect is entirely present while avoiding edge buildup of deposited film at the line of contact between the lip 72 and the substrate. Whether slightly spaced from the surface of the substrate or in contact with the substrate, the bottom wall 54, the leg 77, and the lifting means 24 together define means for supporting the second ring and the pedestal relative to each other at this second predetermined position (B) so that a second deposition will extend across the inner edge band and the adjacent portion of the first zone but is shielded from the outer edge band beyond said second inner periphery defined by the proximity of the lip 72 of the second ring 58. In the slightly spaced condition of position B, the lower ring 58 no longer contacts the substrate, so that it may be necessary to use a secondary clamping means such as an electrostatic chuck to clamp the substrate, as required. The use of an electrostatic chuck clamp is known in the art.

The bottom wall 54, the legs 67 and 77, and the lifting means 24 together define means for now supporting both rings and the pedestal relative to each other at the third predetermined position (C) (FIG. 5) so that a third deposition extends across the zones and to the edge of the substrate. If the third deposition is carried out in a CVD process, as in the deposition of tungsten from tungsten hexafluoride, the substrate would be removed and placed in an appropriate CVD chamber for the equivalent of the described deposition at position C.

FIG. 5 illustrates the ring system at position C (after the prior two deposition steps) with the pedestal carrying the wafer downwardly and clear of the ring system.

While the differences in the lengths of the legs 67, 77 are used to provide the different levels just described, it is evident that a step could be provided in the trough 80 to replace the added length of leg 67.

Assuming the structure as shown, however, it is seen that in FIG. 2, the pedestal 20 has been brought fully upward so that the wafer supports both exclusion rings, the edges of the lips of which rest on and are supporting the rings by contact with the top surface of the wafer 38. And, when the edges of the inner lips 62, 72 of the upper and lower rings are both resting on the substrate, the leg 67 of the upper ring extends lower than the legs 77, 86 of the lower ring. Accordingly, for this construction, the rings provide three levels of shielding depending on the elevation of the pedestal.

As the pedestal is lowered just below the point at which the leg 67 of the upper ring rests the ledge or trough 54, there will be a gap between the upper ring's inner lip 62 and pedestal, as shown in FIGS. 3 and 4. Consequently, the inner diameter of the exposed area on the wafer will be increased because only the lower ring will remain in contact with the pedestal or wafer in position B.

If the pedestal is lowered below the position at which the legs 77, 86 of the lower ring rest on the ledge or trough 54, then both rings will be supported by their legs on the ledge 54, and the inner lips 62, 72 both will be suspended above the wafer and pedestal as shown in FIG. 5. Consequently, in position C, the rings will provide no shadowing or shielding of the wafer perimeter.

FIGS. 6, 7, & 8 show various positions of an alternate embodiment according to the invention. Unlike the earlier embodiments, where the pedestal 20 was raised and lowered to provide contact with and separation from the two exclusion rings, the present embodiment provides the opportunity to vary the edge exclusion area using the exclusion rings without moving the substrate vertically.

As can be seen in FIG. 6, the substrate 38' supported by the support pedestal (or heater) 20' is not moved from a process position during any of the processing steps so that a uniform distance is maintained from the deposition source to the substrate (apart from the film thickness thereon) and all processing steps. In this configuration, the upper exclusion ring 56' and the lower exclusion ring 58' are horizontally positioned by being located within the shield 50'. A boss 84' having a smooth, low friction surface as provided between the upper exclusion ring 56' and the lower exclusion ring 58'. The two exclusion rings 56', 58' are supported on a series of at least three pivoting arms 100 supported by a pivot shaft which are generally equally spaced around the perimeter of the substrate. The arms 100 act like a teeter-totter on the axis 102 simultaneously raise the upper exclusion ring 56' while lowering the lower exclusion ring 58'. The pivot pins may be mounted separately to a turning shaft or may be connected by a flexible link such as a spring or hose such that when a dry end of the flexible spring or hose is turned that each of the pivot pins turns to raise and lower the respective exclusion rings appropriately.

As can be seen in FIGS. 6, 7 and 8 the pivoting of the arm 100 on the pivot shaft 102 provides the same substrate 38' exposure conditions as discussed above. In FIG. 6, the upper exclusion ring 56' is in contact with the substrate 38 and limits the deposition to the diameter of the inner lip 62' of the upper exclusion ring 56'. In FIG. 7 the upper exclusion ring has been raised and the lower exclusion ring 58' has been lowered such that the inner lip 72' of the lower exclusion ring is in contact with substrate 38' thereby limiting the deposition on the surface of the substrate to the diameter of the inner lip 72'.

In FIG. 8 the upper and lower exclusion ring 56', 58' are positioned separated from the substrate 38' and thereby provide a space to allow deposition beyond the inner lips 62', 72' of the two exclusion rings.

Method

In the deposition procedure, the sputtering deposition of the first layer (titanium) is commenced at position A (FIG. 2) to form the film 90 which extends to the shielding limit imposed by the lip 62 of the first ring 56 at 64.

Then the pedestal is lowered to bring the substrate to position B as shown in (FIGS. 3 and 4) and the next film 92 is deposited (titanium nitride). In this position, the first exclusion ring 56 is supported by its leg resting on the wall 54 while the inner ring still rests with its lip in contact with and supported on the wafer or at a slight distance therefrom, as previously discussed.

As the second deposition proceeds it continues to form second film 92 which now extends laterally beyond the first deposition by the difference in diameters of the inner lips 62, 72 of the respective rings so that the second film covers the edge of the first deposition completely as shown in FIG. 4.

Thereafter, the pedestal is lowered away from the rings to position C (FIG. 5) and the wafer fabrication process continued, the edge of film 90 being protected by film 92. Alternatively, a third film 94 deposition may be carried out in a CVD deposition chamber where, for example, a tungsten film can be laid over the second film 92, the deposition atmosphere of the former being isolated from the edge of the first film 90 by film 92, because film 92 overlaps the first film 90 to the outside and protects it from such contact, where the method comprises the following steps: providing an upper shield ring having a upper shield lip which when brought into close proximity to or contact with a substrate on which deposition is performed, shields a portion of the substrate outside an inner perimeter, corresponding to the geometric configuration of the upper shield lip, from deposition; and providing a lower shield ring having a lower shield lip which when brought into close proximity to or contact with a substrate on which deposition is performed, when the upper shield ring does not shield the lower shield ring from deposition, shields a portion of the substrate outside an outer perimeter, corresponding to the geometric configuration of the lower shield lip, from deposition; and wherein the area of the when the substrate is shielded by the lower shield is larger than the area of the substrate exposed when the substrate is shielded by the upper shield ring. While the invention has been described with regards to specific embodiments, those skilled in the art will recognize that changes can be made in form and detail without departing from the spirit and scope of the invention.

What is claimed is:

1. An apparatus comprising:
    a first ring disposed in a substrate processing chamber, a shield portion of said first ring being configured such that when an edge of said shield portion is in contact with the substrate, said shield portion acts as a shield to cover an outer edge band of a substrate from an inner limit of said outer edge band outwardly to substantially prevent deposition of species for forming a film from a deposition process in said chamber from depositing on said substrate outside said inner limit of said outer edge portion of said substrate; and
    a second ring disposed in a substrate processing chamber, a shield portion of said second ring being configured such that when an edge of said shield portion is in contact with the substrate, said shield portion acts as a shield to cover said outer edge band of said substrate and an inner edge band of said substrate from an inner limit of said inner edge band outwardly to substantially prevent deposition of species for forming a film from a deposition process in said chamber from depositing on said substrate outside said inner limit of said inner edge band of said substrate;
    wherein in a first ring configuration said edge of said shield portion of said second ring is in contact with or in close proximity to said substrate, such that both the outer edge band and the inner edge band of the substrate are substantially shielded from the deposition process in the chamber,
    wherein in a second ring configuration said edge of said shield portion of said first ring is in contact with or in close proximity with said substrate, such that said outer edge band of said substrate is substantially shielded from the deposition process in the chamber, and said edge of said shield portion of said second ring is separated from said substrate exposing said inner edge band of said substrate to said deposition process in said chamber.

2. An apparatus as in claim 1,
    wherein in a third ring configuration both said first ring and said second ring are separated from said substrate.

3. An apparatus as in claim 1,
    wherein in said second ring configuration said second ring is held separated from said substrate during processing in the processing chamber by a shield member, where relative motion between said shield member and said first ring causes said second ring to move from a position where said edge of said shield portion of said second shield ring is in contact with said substrate to a position where it is separated from said substrate exposing said inner edge band of said substrate to said deposition process in said chamber.

4. An apparatus as in claim 3,
    wherein said shield member is fixed to a wall of said processing chamber and relative motion between said second ring and said processing chamber occurs as the substrate, supported on a substrate support, is moved relative to said shield member fixed to said wall.

5. An apparatus as in claim 3,
    wherein said second ring includes an extension portion connected to said shield portion wherein said extension portion is configured to contact a portion of said shield member to provide relative motion between said second ring and said substrate.

6. A shadow ring system for use in vapor deposition apparatus for depositing a plurality of successive films on a substrate, said apparatus including a pedestal for supporting said substrate and moving said pedestal to one of a plurality of deposition positions in elevation therein, comprising:
    a first shadow ring positioned above said substrate and pedestal to extend over a first zone overlying the perimeter of said substrate up to a first deposition periphery,
    a second shadow ring nested between said first ring and about said substrate to extend over a second zone overlying the perimeter of said substrate outwardly of said first periphery of first zone to a second deposition periphery lying outwardly of said first periphery,
    wherein said first ring and said pedestal are supported relative to each other at a first position (A) in which said first ring shields the substrate from a first film deposition beyond said first periphery,
    wherein said first ring is supported in a spaced relation to said substrate to leave the second ring exposed when said pedestal is lowered to a second position (B), and
    wherein said second ring and said pedestal are supported relative to each other at said second position (B) so that a second deposition extends across a inner periphery and the adjacent portion of said first zone but is shielded from the second zone beyond an second inner periphery by said second ring.

7. The shadow ring system as in claim 6,
    wherein said second ring and said pedestal are supported relative to each other at third position (C) during a third deposition so that a third deposition extends across said first inner periphery and the adjacent portion of said first zone and said second zone beyond said second inner periphery.

8. The shadow ring system as in claim 6,
    wherein said first ring is provided with a first downwardly depending leg extending towards a support member, said second ring is provided with a second downwardly depending leg extending towards a support member, said first leg having an effective length such that lowering of said pedestal separates said first ring from the substrate before and independently of separating said second ring from said substrate.

9. A shadow ring system for use in vapor deposition apparatus for deposition of layers of material on a substrate, said apparatus including a pedestal for supporting and moving said substrate between a plurality of positions in elevation therein, comprising:

a first shadow ring having a inner edge terminating in a lip extending downwardly for shadowing said substrate along a first line from deposition outside of said first line when said first ring is proximate said substrate, said first ring extending outwardly to an outer edge substantially beyond the edge of said pedestal and further having an downwardly extending support leg encircling said pedestal and forming a gap there between, a second shadow ring positioned below and nested within said first shadow ring and having an inner peripheral edge surrounding the perimeter of an inner peripheral edge of said first ring, said inner peripheral edge having a lip extending downwardly for shadowing said substrate or layer along a second line from deposition outside said second line when said second ring is proximate said substrate, said first shadow ring inner lip and edge being spaced from and entirely separate and exclusive of the outside of the boundary of said second shadow ring, said first ring having a downwardly depending first leg at its outer edge, said second ring having a downwardly depending second leg at its outer edge and positioned within the perimeter defined by said first leg, a first support for supporting said first leg at a first position, and a second support supporting said second leg at a second position of said substrate spaced from said first position.

10. A method for depositing a film on a substrate in an apparatus having a pedestal for supporting said substrate comprising, the steps of:

providing a first ring positioned above a substrate supported on a pedestal and extending over a first shielded zone overlying the perimeter of said substrate to a first inner periphery, providing a second ring nested between said first ring and said substrate and extending over a second shielded zone overlying the perimeter of said substrate outwardly of said first shield zone to a second inner periphery which is located outwardly of said first inner periphery, supporting said first ring in a first shadow ring position relative to said substrate which also encloses and shields the second ring from exposure to film deposition, supporting said second ring in a second shadow ring position spaced from said first position, depositing a first film on said substrate over defined inside said first inner periphery, separating said first ring from said substrate to expose the second ring to film deposition thereby expanding the zone of deposition to an area inside said second inner periphery, and depositing a second film on said substrate which thereby extends outwardly to cover the edge of said first film deposition defined by the first inner periphery.

11. A method for depositing a series of film layers on a substrate in a single processing chamber, where each successive layer overlaps the edge of the prior deposited layer, comprising the steps of:

providing an upper shield ring having a upper shield lip which when brought into close proximity to or contact with a substrate on which deposition is performed, shields a portion of the substrate outside an inner perimeter, corresponding to the geometric configuration of the upper shield lip, from deposition; and providing an lower shield ring having a lower shield lip which when brought into close proximity to or contact with a substrate on which deposition is performed, when the upper shield ring does not shield the lower shield ring from deposition, shields a portion of the substrate outside an outer perimeter, corresponding to the geometric configuration of the lower shield lip, from deposition; and wherein the area of said substrate exposed when said substrate is shielded by said lower shield is larger than the area of said substrate exposed when said substrate is shielded by said upper shield ring.

* * * * *